US006696891B2

United States Patent
Noro et al.

(10) Patent No.: US 6,696,891 B2
(45) Date of Patent: Feb. 24, 2004

(54) CLASS D AMPLIFIER

(75) Inventors: Masao Noro, Hamamatsu (JP); Yasuhiko Sekimoto, Hamakita (JP)

(73) Assignee: Yamaha Corporation, Hamamatsu (JP)

(*) Notice: Subject to any disclaimer, the term of this patent is extended or adjusted under 35 U.S.C. 154(b) by 0 days.

(21) Appl. No.: 10/251,169

(22) Filed: Sep. 20, 2002

(65) Prior Publication Data
US 2003/0058038 A1 Mar. 27, 2003

(30) Foreign Application Priority Data

Sep. 21, 2001 (JP) .................................. P2001-289824

(51) Int. Cl.[7] ................................................ H03F 3/38
(52) U.S. Cl. ...................... 330/10; 330/207 A; 330/251
(58) Field of Search ........................... 330/10, 207 A, 330/251

(56) References Cited

U.S. PATENT DOCUMENTS 5,949,282 A * 9/1999 Nguyen et al. ............... 330/10
5,974,089 A   10/1999 Tipathi et al. ............... 375/247
5,986,498 A * 11/1999 Rodriguez .................... 330/10

FOREIGN PATENT DOCUMENTS

JP   61-21007   5/1986
JP   11-112245  4/1999

* cited by examiner

Primary Examiner—Khanh Van Nguyen
(74) Attorney, Agent, or Firm—Pillsbury Winthrop LLP

(57) ABSTRACT

A class D amplifier includes: an integrating circuit (1) which integrates an input signal; a flash A/D converter (2) which A/D converts an output signal of the integrating circuit; a waveform converting circuit (3) which produces a PWM signal based on an output of the flash A/D converter; a switching circuit which is includes a pair of MOS transistors (5, 6) connected between a first power source and a second power source, the junction point P of the pair of MOS transistors being connected to a loudspeaker (51); a driving circuit (4) which drives the pair of MOS transistors on the basis of the PWM signal; and a feedback resistor ($R_{NF}$) which is connected between the junction point P and the input side of the integrating circuit, and negatively feeds back the output signal of the amplifier.

4 Claims, 8 Drawing Sheets

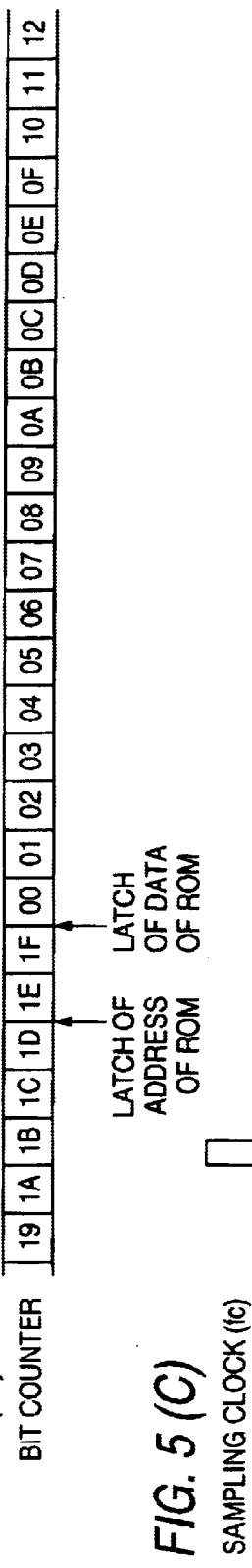
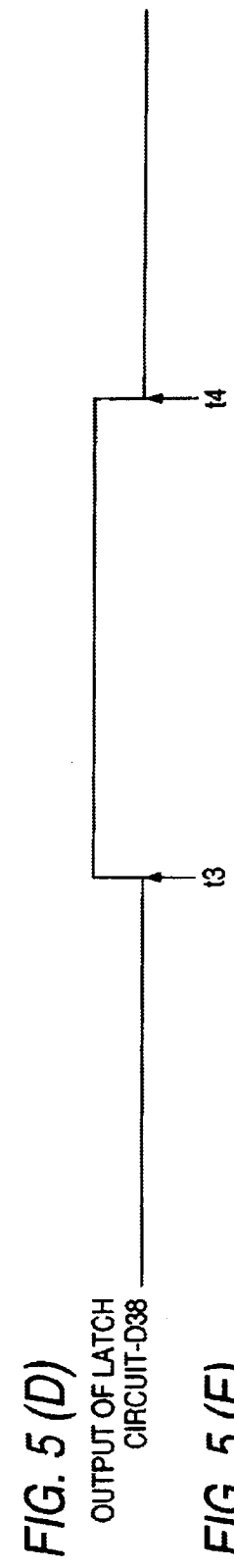
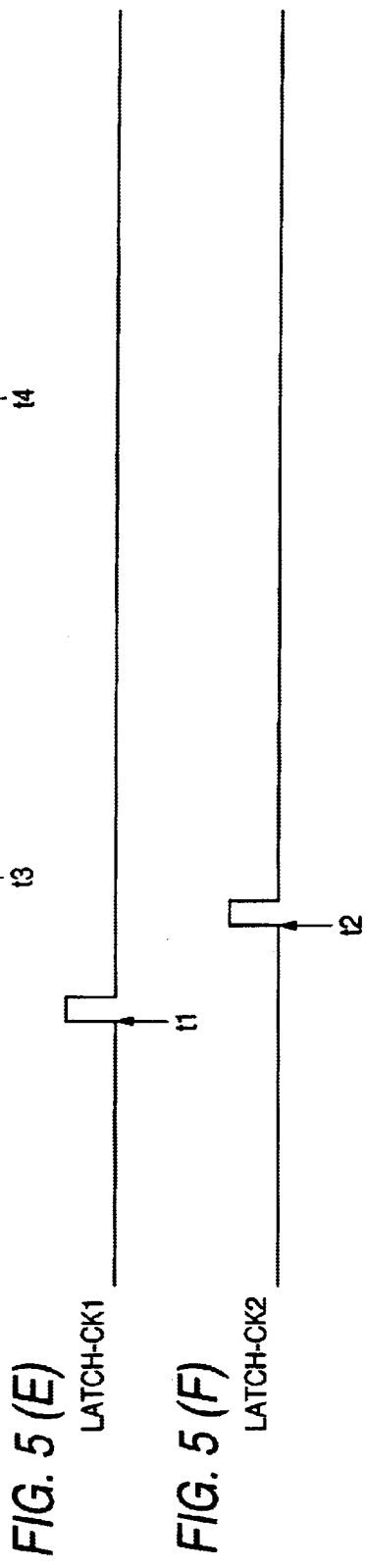
FIG. 5 (A) CLOCK CK0 (22.6MHZ)
FIG. 5 (B) BIT COUNTER
FIG. 5 (C) SAMPLING CLOCK (fc)
FIG. 5 (D) OUTPUT OF LATCH CIRCUIT-D38
FIG. 5 (E) LATCH-CK1
FIG. 5 (F) LATCH-CK2

CLASS D AMPLIFIER

BACKGROUND OF THE INVENTION

The present invention relates to a class D amplifier, and more particularly to a class D amplifier which is suitable for amplifying the power of an audio signal.

As one of conventional class D amplifiers, known is a separately excited PWM amplifier shown in FIG. 8. In the figure, 101 denotes a carrier signal generator, 102 denotes an input terminal, 103 denotes an adder, 104 denotes a voltage comparator, 105 denotes a pulse amplifier, 106 and 106' denote switching elements, 107 denotes a low-pass filter, 108 denotes a load, and 109 and 109' denote power source terminals.

FIG. 9 shows operation waveforms at various portions. In the figure, S1 indicates a carrier signal, S2 indicates an input signal, S3 indicates a PWM signal, and S4 indicates an output signal.

In the configuration, the adder 103 adds the triangular carrier signal S1 which is generated by the carrier signal generator 101, and the input signal S2. The output of the adder is supplied to the voltage comparator 104.

The voltage comparator 104 compares the signal applied from the adder 103 with a reference voltage of a constant level, and outputs a result of the comparison. Consequently, the output of the voltage comparator 104 is the PWM signal S3 which is obtained by pulse-width modulating the input signal S2. The PWM signal S3 drives the switching elements 106 and 106' by using the pulse amplifier 105 as a driving circuit.

Positive and negative power source voltages of the same level are applied to the switching elements 106 and 106' via the power source terminals 109 and 109', respectively. Therefore, a signal which is similar to the PWM signal S3, and in which the positive and negative voltage values are equal to the positive and negative power source voltages applied to the switching elements 106 and 106' is applied to the input of the low-pass filter 107. The low-pass filter 107 removes from the signal the high frequency components due to the carrier signal S1, and supplies a power-amplified output signal S4 which is similar to the input signal S2, to the load.

Another conventional class D amplifier is a 1-bit amplifier. FIG. 10 shows the configuration of a 1-bit amplifier. Referring to the figure, the 1-bit amplifier 200 has an adder 201, an integrator 202, a comparator 203 having hysteresis characteristics, and a delay circuit 204. The reference numeral 205 denotes an input terminal to which an analog signal is input, and 206 denotes an output terminal from which a 1-bit data is output.

In the configuration, the analog signal X input through the input terminal 205, and a quantized signal +V or −V which is output from the delay circuit 204, and which corresponds to 1 bit are added to each other by the adder 201. The output of the adder 201 is integrated by the integrator 202, and then supplied to the comparator 203. In the comparator 203, the incoming output of the integrator 202 is compared with a reference voltage. If the output polarity is plus, the digital output is 1, and the maximum value +V of the analog input which is to be A/D converted is fed back as a quantized output to the adder 201.

If the output polarity is minus, the digital output is 0, and −V is fed back as a quantized output to the adder 201. In this way, a 1-bit output Y such as shown in FIG. 11 is output from the 1-bit amplifier 200.

Among the above-mentioned conventional class D amplifiers, the separately excited PWM amplifier cannot be configured so as to negatively feed back the output of the amplifier to the input side, and hence has a problem in that it is difficult to improve the S/N ratio and reduce the distortion factor. In a self excited PWM amplifier, the S/N ratio can be improved, and the distortion factor can be reduced, but there is a problem in that the oscillation frequency cannot be controlled.

Among the conventional class D amplifiers, the 1-bit amplifier must be operated at a very high switching frequency in order to improve the S/N ratio and reduce the distortion factor, thereby producing a problem in that the amplifier is disadvantageous from the viewpoints of the amplifier efficiency, the audio performance, etc.

SUMMARY OF THE INVENTION

The invention has been conducted in view of the circumstances. It is an object of the invention to provide a class D amplifier in which the S/N ratio and the reduction of the distortion factor can be improved.

In order to solve the aforesaid object, the invention is characterized by having the following arrangement.

(1) A class D amplifier comprising:
   an integrating circuit for integrating an input signal;
   a flash A/D converter for A/D converting an output signal of the integrating circuit;
   a waveform converting circuit for producing a PWM signal including a pulse width corresponding to a digital value output from the flash A/D converter;
   a switching circuit, for producing an amplified signal, including a pair of switching elements connected between a first power source and a second power source, a junction portion of the pair of switching elements being connected to a load;
   a driving circuit for driving the pair of switching elements on the basis of the PWM signal output from the wave form converting circuit; and
   a feedback circuit which is connected between the junction point of the pair of switching elements and an input side of the integrating circuit, and negatively feeds back the amplified signal that is to be supplied to the load.

(2) The class D amplifier according to (1), wherein the waveform converting circuit includes:
   a storing unit for storing waveform information of the PWM signal of a pulse width corresponding to the digital value;
   a reading unit for reading out the waveform information of the PWM signal from the storing unit on the basis of the digital value output from the flash A/D converter; and
   an outputting unit for outputting the PWM signal on the basis of the waveform information which is read out by the reading unit.

(3) The class D amplifier according to (1), wherein a low-pass filter for removing signal components of carrier frequency from the amplified signal is interposed between the junction potion of the pair of switching elements and the load, and the feedback circuit is connected to an input side of the low-pass filter.

(4) The class D amplifier according to (1), wherein the feedback circuit includes: a first feedback loop which allows high frequency components of the output signal that is to be supplied to the load, to pass; and a second feedback loop which allows low frequency components of the output signal to pass.

BRIEF DESCRIPTION OF THE DRAWINGS

FIG. 5 is a timing chart showing operation states of various portions of the waveform converting circuit shown in FIG. 4.

DETAILED DESCRIPTION OF PREFERRED EMBODIMENTS

Figure 1:
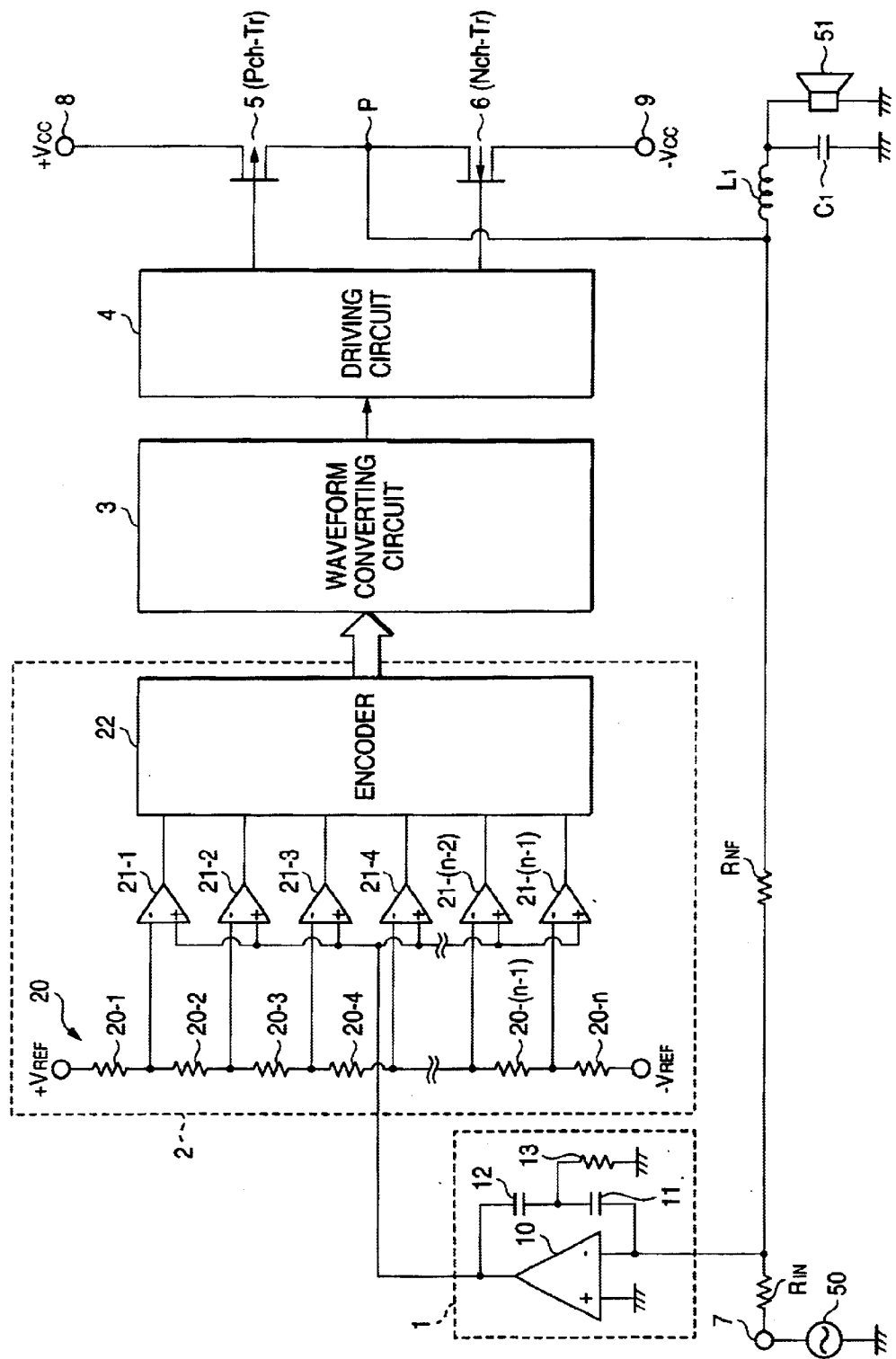
FIG. 1 is a block diagram showing the configuration of a class D amplifier which is a first embodiment of the invention.

Hereinafter, embodiments according to the invention will be described in detail with reference to the accompanying drawings. FIG. 1 shows the configuration of a class D amplifier which is a first embodiment according to the invention. Referring to the figure, the class D amplifier according to the embodiment includes: an integrating circuit 1 which integrates an input signal; a flash A/D converter 2; a waveform converting circuit 3; a driving circuit 4; and a pair of MOS transistors 5 and 6 which are connected between power source terminals 8 and 9, and which serve as a pair of switching elements.

A first power source which supplies a positive power source voltage $+V_{CC}$ is connected to the power source terminal 8, and a second power source which supplies a negative power source voltage $-V_{CC}$ is connected to the power source terminal 9. A junction point P of the MOS transistors 5 and 6 is connected to a loudspeaker 51 serving as a load, via a low-pass filter configured by an inductance $L_1$ and a capacitor $C_1$.

The integrating circuit 1 is configured by: an operational amplifier 10; capacitors 11 and 12 which are connected in series between the inverting input terminal and the output terminal of the operational amplifier 10; and a resistor 13 in which one end is connected to a junction point of the capacitors 11 and 12, and the other end is grounded. The non-inverting input terminal of the operational amplifier 10 is grounded, and the inverting input terminal is connected to an input terminal 7 via an input resistor $R_{111}$.

A signal source 50 which outputs an analog signal such as an audio signal is connected between the input terminal 7 and the ground. The inverting input terminal of the operational amplifier 10 is connected to the junction point P of the MOS transistors 5 and 6 via a feedback resistor $R_{NF}$.

The feedback resistor $R_{NF}$ functions as a feedback circuit which is connected between the junction point P of the MOS transistors 5 and 6 and the input side of the integrating circuit 1, and which negatively feeds back an output signal of the amplifier that is to be supplied to the loudspeaker 51 serving as the load.

The flash A/D converter 2 includes: a reference voltage generating circuit 20 which is configured by a group of resistors 20-1, 20-2, ..., 20-n that are connected in series between reference voltages $+V_{REF}$ and $-V_{REF}$, and which outputs weighted reference voltages; comparators 21-1, 21-2, ..., 21-(n−1) to which the weighted reference voltages output from the reference voltage generating circuit 20 are respectively input; and an encoder 22.

In the comparators 21-1, 21-2, ..., 21-(n−1), input terminals on one side are connected to the junction points of adjacent ones of the resistors 20-1, 20-2, ..., 20-n forming the reference voltage generating circuit 20, respectively, and those on the other side are commonly connected to the output terminal of the operational amplifier 10 which is the output terminal of the integrating circuit 1. The output terminals of the comparators 21-1, 21-2, ..., 21-(n−1) are connected to input terminals of the encoder 22, respectively.

In the above configuration, the analog signal supplied from the signal source 50 is input to the inverting input terminal of the operational amplifier 10 forming the integrating circuit 1, via the input resistor $R_{111}$.

A signal which is switched over by the MOS transistors 5 and 6 to be inverted between the power source voltages $+V_{CC}$ and $-V_{CC}$ is input together with the analog signal to the inverting input terminal of the operational amplifier 10, via the feedback resistor $R_{NF}$.

The integrating circuit 1 integrates a signal which is obtained by adding the analog signal that is supplied from the signal source 50, and the signal that is switched over by the MOS transistors 5 and 6 and supplied from the junction point P via the feedback resistor $R_{NF}$. The integration output of the circuit is supplied to the flash A/D converter 2.

In the flash A/D converter 2, the incoming integration output (analog signal) is judged in a moment to coincide with which one of reference voltage values (comparison voltage values), by using the comparators 21-1, 21-2, ..., 21-(n−1). The reference voltage value is supplied to the encoder 22.

The encoder 22 then converts the reference voltage value which coincides with the incoming analog signal, into an N-bit (in the embodiment, 5-bit) binary code. The digital data is supplied to the waveform converting circuit 3.

The waveform converting circuit 3 produces a PWM signal of a pulse width that corresponds to the digital value of the digital data output from the flash A/D converter 2, and supplies the signal to the driving circuit 4.

The driving circuit 4 drives the MOS transistors 5 and 6 in accordance with the PWM signal output from the waveform converting circuit 3.

As a result, the MOS transistors 5 and 6 performs the switching operation by a signal which is output from the driving circuit 4 and similar to the PWM signal, so that the pulse output voltage which is inverted between the power source voltages $+V_{CC}$ and $-V_{CC}$ is supplied to the loudspeaker 51 via the low-pass filter configured by the inductance $L_1$ and the capacitor $C_1$. A Part of the pulse output voltage is negatively fed back to the input terminal of the integrating circuit 1 via the feedback resistor $R_{NF}$. The low-pass filter configured by the inductance $L_1$ and the capacitor $C_1$ removes signal components of the carrier frequency from the output of the amplifier.

As described above, in the class D amplifier of the embodiment, the analog signal supplied from the signal source 50 is integrated by the integrating circuit 1, the integration output is rapidly A/D converted by the flash A/D converter 2, and the amplifier output which is a digital-like pulse signal is negatively fed back to the input side of the integrating circuit. Namely, the integrating circuit 1 integrates a signal which is obtained by adding the analog signal that is supplied from the signal source 50, and the amplifier output that is negatively fed back, and functions as an integrating circuit forming a delta sigma modulator.

Figure 2:
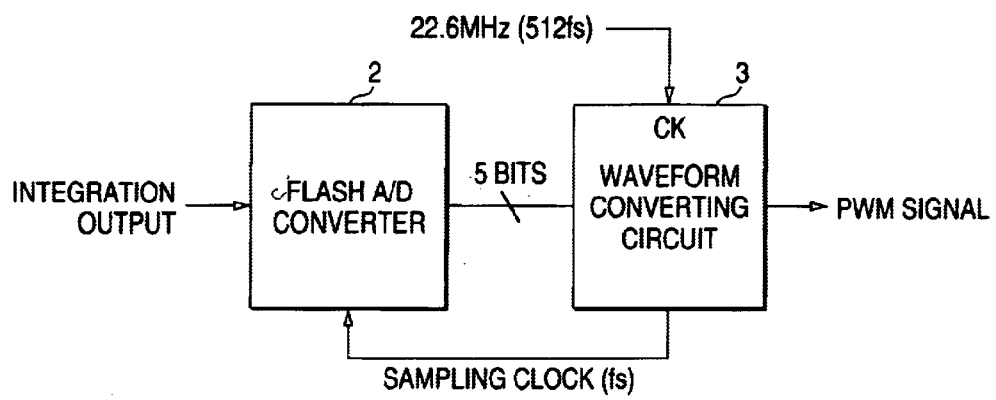
FIG. 2 is a diagram showing relationships between a flash A/D converter and a waveform converting circuit in the class D amplifier shown in FIG. 1.

Next, the waveform converting circuit 3 will be specifically described. As shown in FIG. 2, the waveform converting circuit 3 supplies a sampling clock of a sampling frequency fs to the flash A/D converter 2, and, on the basis of the 5-bit digital data supplied from the flash A/D converter 2, outputs to the driving circuit 4 the PWM signal of a pulse width which corresponds to the digital value of the data.

Figure 3:
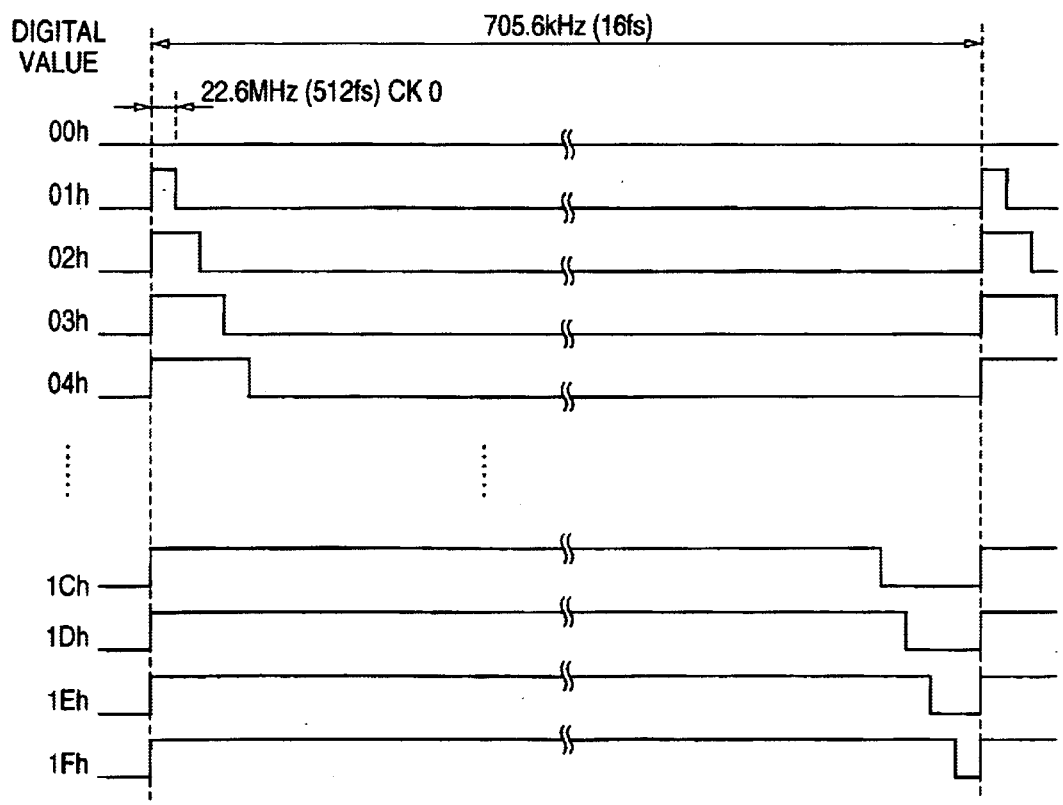
FIG. 3 is a chart showing relationships between digital data output from the class D amplifier shown in FIG. 1, and a PWM signal output from the waveform converting circuit.

The waveform converting circuit 3 operates in synchronization with a clock CK0 of, for example, 22.6 MHz (512 fs), and, as shown in FIG. 3, converts the 5-bit digital value into the PWM signal of a pulse width of one of 0 to 31 unit periods (705.6 kHz (16 fs)) which use the pulse width of the clock CK0 as a unit.

Figure 4:
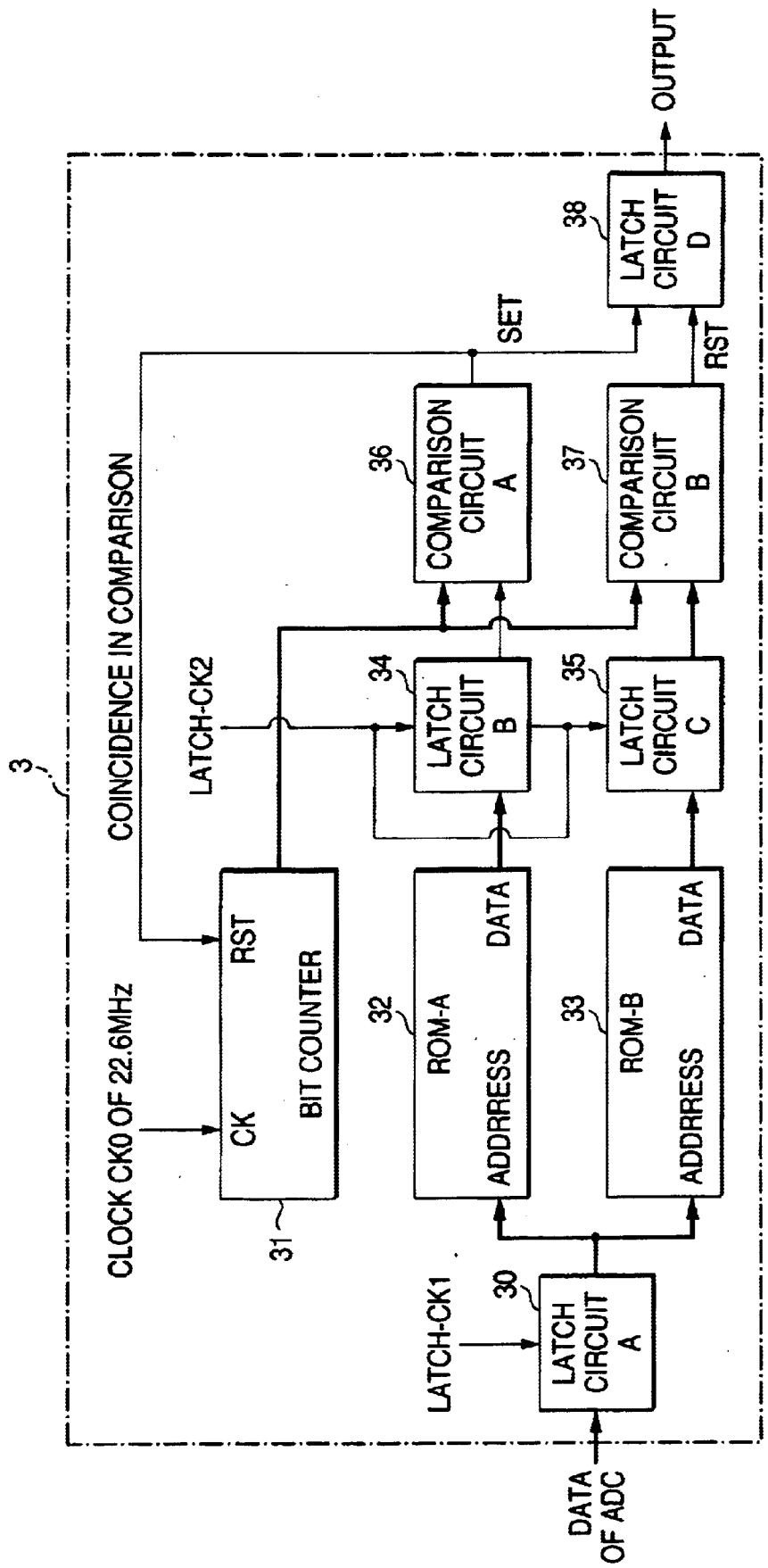
FIG. 4 is a block diagram specifically showing the configuration of the waveform converting circuit in the class D amplifier shown in FIG. 1.

Next, FIG. 4 specifically shows the configuration of the waveform converting circuit 3. Referring to the figure, the waveform converting circuit 3 includes: a latch circuit-A 30; a bit counter 31; a ROM-A 32 and a ROM-B 33 which store waveform data; a latch circuit-B 34 which latches a data output from the ROM-A 32; and a latch circuit-C 35 which latches a data output from the ROM-B 33.

Further, the waveform converting circuit 3 includes: a comparison circuit-A 36 which compares the digital value latched by the latch circuit-B 34 with the output of the bit counter 31, and which, if the two values coincide with each other, supplies a set (SET) signal to a latch circuit-D 38, and resets the bit counter 31; a comparison circuit-B 37 which compares the digital value latched by the latch circuit-C 35 with the output of the bit counter 31, and which, if the two values coincide with each other, supplies a reset (RST) signal to the latch circuit-D 38; and the latch circuit-D 38 which latches the outputs of the comparison circuit-A 36 and the comparison circuit-B 37.

The latch circuit-A 30 latches the digital data output from the flash A/D converter 2 in synchronization with an output timing (rising) of a clock LTACH-CK1.

The latch circuit-B 34 and the latch circuit-C 35 latch the data output from the ROM-A 32 and the ROM-B 33 in synchronization with an output timing (rising) of a clock LTACH-CK2, respectively.

In the ROM-A 32, a timing data which designates the rising timing of the PWM signal according to each of the digital values is stored at an address corresponding to the digital value. In the ROM-B 33, a timing data which designates the falling timing of the PWM signal according to each of the digital values is stored at an address corresponding to the digital value.

The bit counter 31 is a 5-bit counter which is operated by the clock CK0 of 22.6 MHz (512 fs) ((A) of FIG. 5), or a base-32 counter which counts from "00" to "1F" in the hexadecimal representation ((B) of FIG. 5).

The operation of the thus configured waveform converting circuit 3 will be described with reference to the timing chart of FIG. 5. The digital data is latched at time t1 by the latch circuit-A 30 in synchronization with the rising of the clock LTACH-CK1 ((E) of FIG. 5). The digital data (digital value) which is latched by the is supplied to the ROM-A 32 and the ROM-B 33.

As a result, a timing data indicating the rising timing of the PWM signal which corresponds to the digital value of the digital data output from the flash A/D converter 2 is read out from the ROM-A 32, and a timing data indicating the falling timing of the PWM signal which corresponds to the digital value of the digital data is read out from the ROM-B 33.

The timing data read out from the ROM-A 32 and the ROM-B 33 are latched at time t2 by the latch circuit-B 34 and the latch circuit-C 35, respectively, in synchronization with the rising of the clock LATCH-CK2 ((F) of FIG. 5). It is assumed that the timing data read out from the ROM-A 32 is "1F" and that read out from the ROM-B 33 is "0A".

The timing data "1F" latched by the latch circuit-B 34 is input to the comparison circuit-A 36, and the timing data "0A" latched by the latch circuit-C 35 is input to data "0A" latched by the latch circuit-C 35 is input to the comparison circuit-B 37.

The comparison circuit-A 36 outputs the set signal to the latch circuit-D 38 at the timing of the rising of the clock CK0 after the output of the bit counter 31 becomes "1F", and outputs the set signal as a reset signal to the reset (RST) terminal of the bit counter 31.

As a result, the bit counter 31 begins the counting operation with starting from "00", and the latch circuit-D 38 outputs the PWM signal which becomes high at time t3.

Then, the comparison circuit-B 37 outputs the reset (RST) signal to the latch circuit-D 38 at timing t4 of the rising of the clock CK0 after the timing data "0A" input to the comparison circuit-B 37 coincides with the output of the bit counter 31.

As a result, the output of the latch circuit-D 38 is set to the low level. In this way, the PWM signal which rises at time t3 and falls at time t4 is output ((D) of FIG. 5). In FIG. 5, (C) shows the sampling clock which is supplied from the waveform converting circuit 3 to the flash A/D converter 2.

The class D amplifier of the first embodiment of the invention which has been described above includes: the integrating circuit 1 which integrates the input signal; the flash A/D converter 2 which rapidly A/D converts the output signal of the integrating circuit 1; the waveform converting circuit 3 which produces the PWM signal of the pulse width that corresponds to the digital value output from the flash A/D converter 2; the switching circuit which is configured by the pair of MOS transistors 5 and 6 connected between the first power source and the second power source, the junction point of the pair of MOS transistors 5 and 6 being connected to the load 51; the driving circuit 4 which drives the pair of MOS transistors 5 and 6 on the basis of the PWM signal output from the waveform converting circuit 3; and the feedback circuit (feedback resistor $R_{NF}$) which is connected between the junction point of the pair of MOS transistors 5 and 6 and the input side of the integrating circuit 1, and which negatively feeds back the output signal of the amplifier that is to be supplied to the load 51. Therefore, the S/N ratio and the reduction of the distortion factor can be improved.

In the class D amplifier of the first embodiment of the invention, the waveform converting circuit 3 includes: the ROM-A 32 and the ROM-B 33 which serve as storing means for storing waveform information of the PWM signal of a pulse width that corresponds to the digital value; the latch circuit-A 30, the latch circuit-B 34, and the latch circuit-C 35 which serve as reading means for reading out the waveform information of the PWM signal on the basis of the digital value output from the flash A/D converter 2; and the bit counter 31, the comparison circuit-A 36, the comparison circuit-B 37, and the latch circuit-D 38 which serve as outputting means for outputting the PWM signal on the basis of the read-out waveform information. Therefore, the switching frequency can be managed, and even an input of a signal in synchronized relationship, such as a 1-bit signal is enabled.

Figure 6:
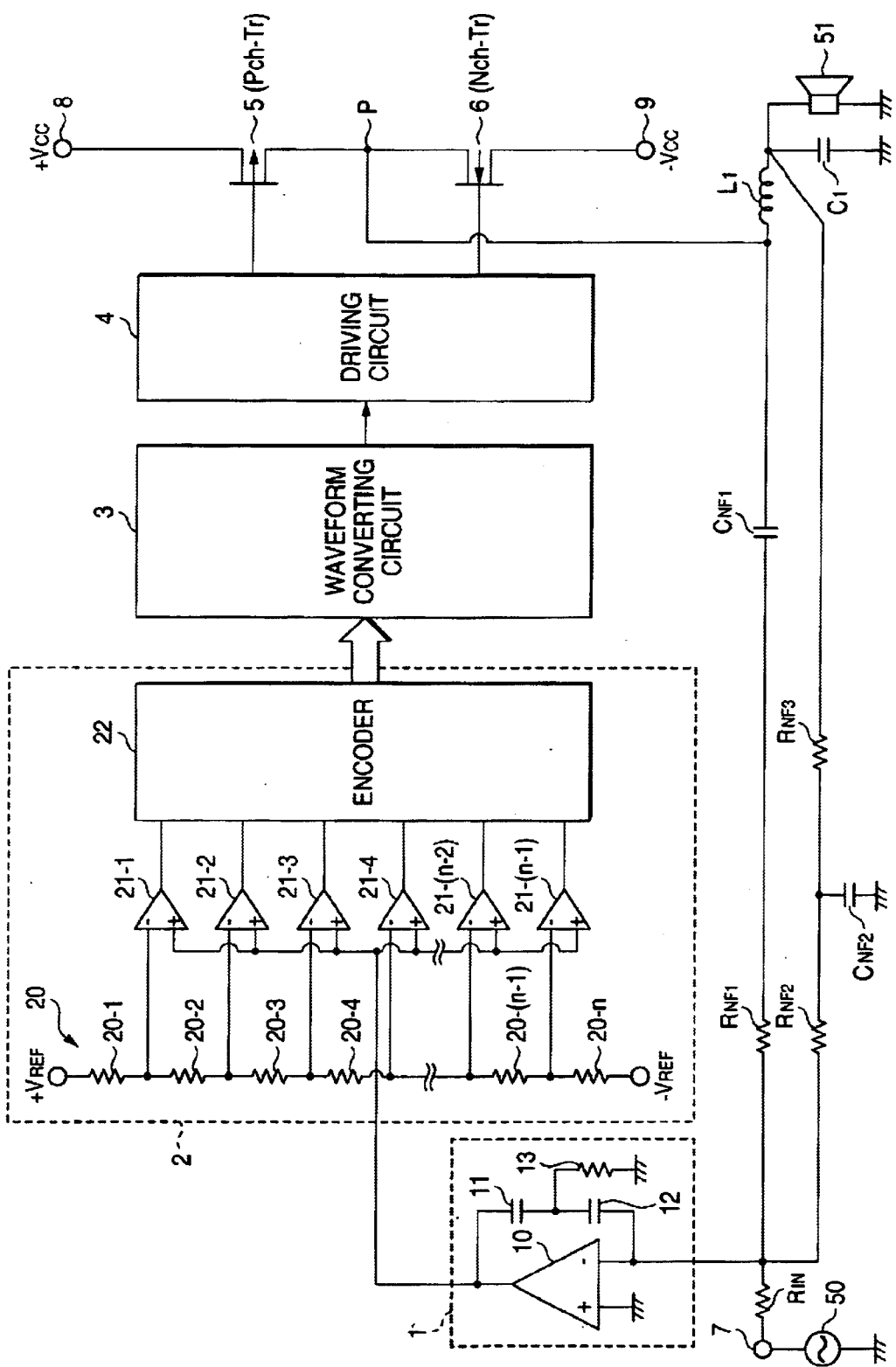
FIG. 6 is a block diagram specifically showing the configuration of a class D amplifier which is a second embodiment of the invention.

Next, FIG. 6 shows the configuration of a class D amplifier according to a second embodiment of the invention. The class D amplifier according to the embodiment is identical in configuration with that of the first embodiment shown in FIG. 1, except the feedback circuit. Therefore, identical components are denoted by the same reference numerals, and duplicated description will be omitted.

As shown in the figure, the class D amplifier of the embodiment is characterized in that the feedback circuit which feeds back the output of the amplifier to the input side of the integrating circuit 1 is configured by a multiple feedback circuit constituted by: a first feedback loop which allows high frequency components of the output signal that is to be supplied to the load, to pass; and a second feedback loop which allows low frequency components of the output signal to pass.

In the feedback circuit, the first feedback loop is formed by connecting a series circuit of a feedback resistor $R_{NF1}$ and a feedback capacitor $C_{NF1}$ between the junction point P of the MOS transistors 5 and 6 and the inverting input terminal of the operational amplifier 10 forming the integrating circuit 1.

The second feedback loop is formed by connecting a T-circuit consisting of feedback resistors $R_{NF2}$ and $R_{NF3}$ and a feedback capacitor $C_{NF2}$ between the output terminal of the low-pass filter configured by the inductance $L_1$ and the capacitor $C_1$, and the inverting input terminal of the operational amplifier 10 constituting the integrating circuit 1.

In the T-circuit, a series circuit of the feedback resistors $R_{NF2}$ and $R_{NF3}$ is connected between the output terminal of the low-pass filter and the inverting input terminal of the operational amplifier 10 constituting the integrating circuit 1, and the feedback capacitor $C_{NF2}$ is connected between the junction point of the feedback resistors $R_{NF2}$ and $R_{NF3}$ in the series circuit, and the ground, thereby constituting the second feedback loop.

When the resistance of the resistor $R_{NF1}$ is indicated by R and the capacitance of the feedback capacitor $C_{NF1}$ is indicated by C, the resistances of the feedback resistors $R_{NF2}$ and $R_{NF3}$ are $R_{NF3}=R_{NF3}=R/2$, and the capacitance of the feedback capacitor $C_{NF2}$ is $C_{NF2}=4C$.

Figure 7:
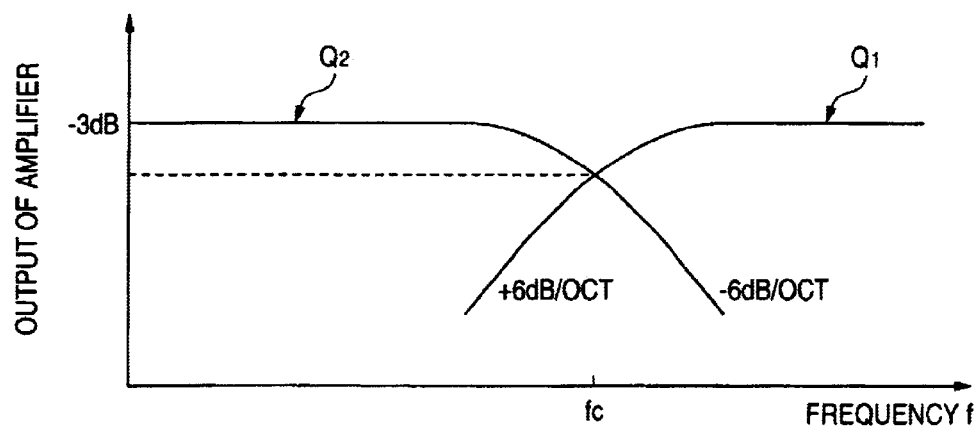
FIG. 7 is a characteristic diagram showing frequency characteristics of the output of the class D amplifier of the second embodiment of the invention shown in FIG. 6.
Figure 8:
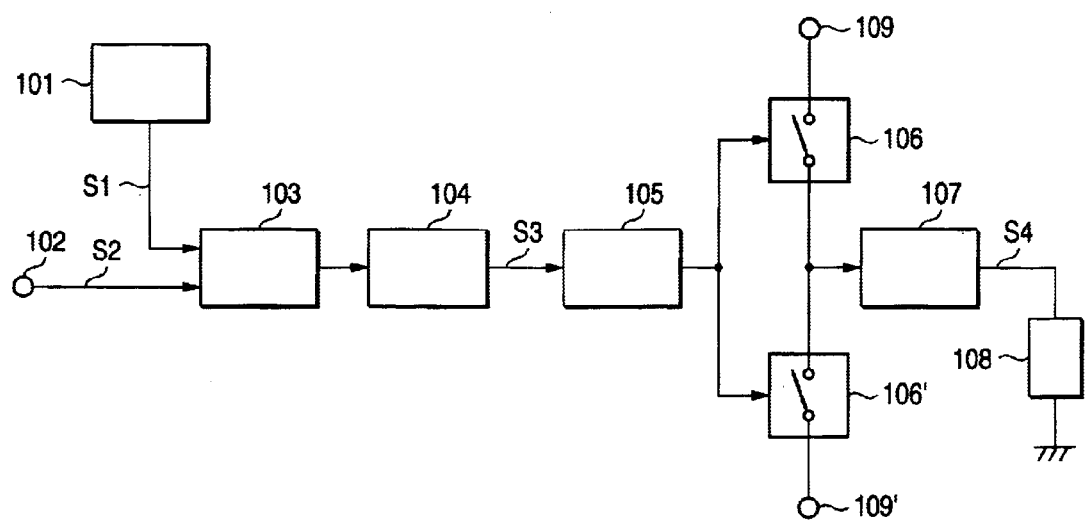
FIG. 8 is a block diagram specifically showing the configuration of a conventional separately excited PWM amplifier of the analog type.
Figure 9:
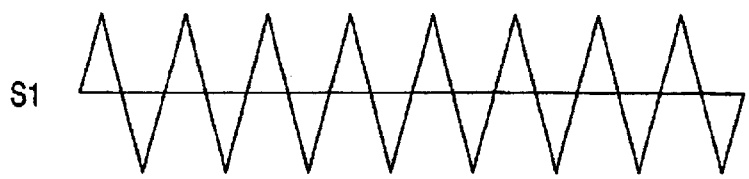
FIG. 9 is a waveform chart showing operation states of various portions of the conventional separately excited PWM amplifier shown in FIG. 8.
Figure 9:
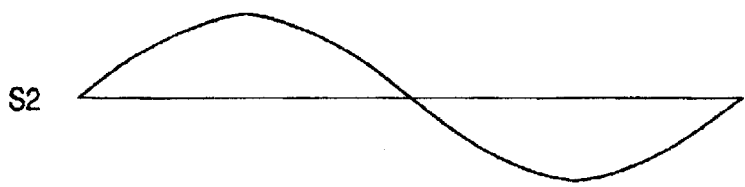
Figure 9:
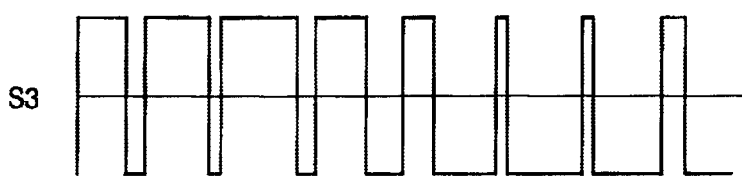
Figure 9:
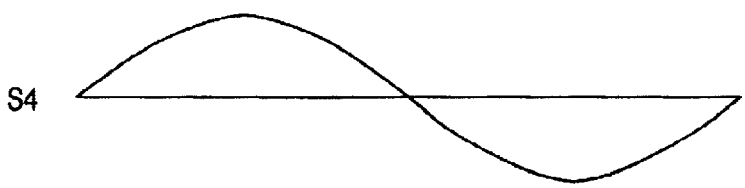
Figure 10:
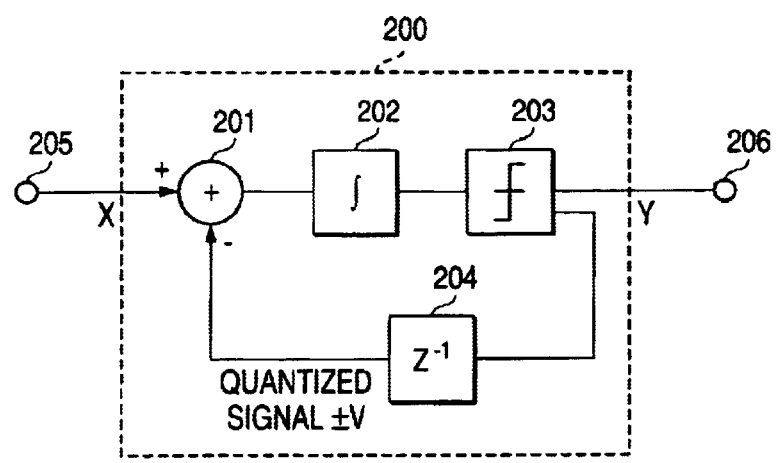
FIG. 10 is a block diagram conceptually showing the configuration of a conventional 1-bit amplifier.
Figure 11:
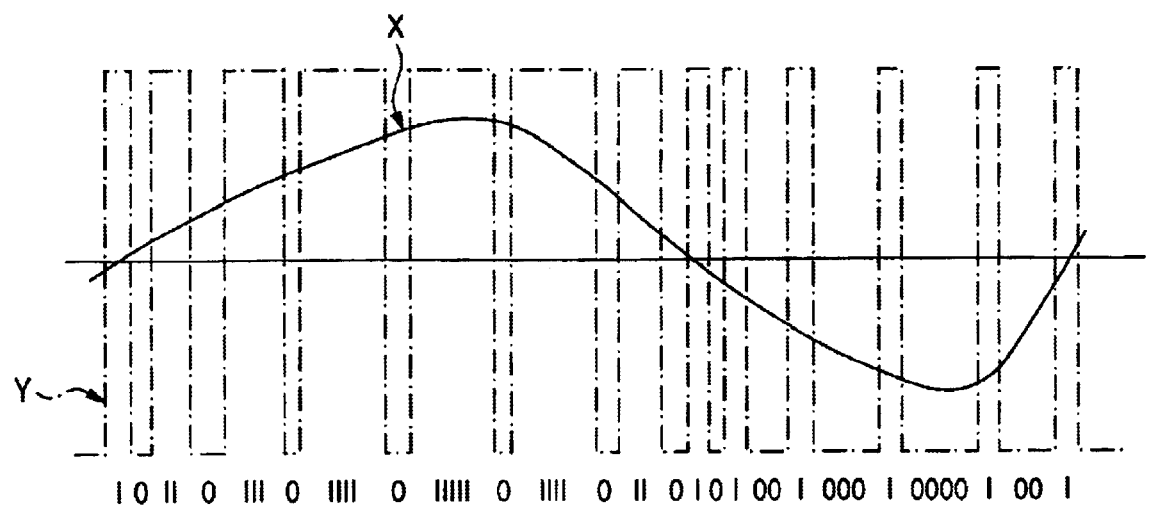
FIG. 11 is a chart showing waveforms of input and output signals in the 1-bit amplifier shown in FIG. 10.

As shown in FIG. 7, the first feedback loop provides the frequency characteristic Q1 which allows high frequency components of the output signal that is to be supplied to the loudspeaker 51, to pass, and the second feedback loop provides the frequency characteristic Q2 which allows low frequency components of the output signal that is to be supplied to the loudspeaker 51, to pass. The resulting frequency characteristic which is obtained by combining the frequency characteristics Q1 and Q2 with each other is flat over the frequency zone ranging from the low frequency band to the high frequency band.

In both the frequency characteristics Q1 and Q2, the cut-off frequency fc at which the output is −3 dB is $fc=1/2\pi CR$, and set to, for example, 10 kHz.

In the class D amplifier according to the second embodiment of the invention, the feedback circuit is configured by: the first feedback loop which allows high frequency components of the output signal that is to be supplied to the load, to pass; and the second feedback loop which allows low frequency components of the output signal to pass. Therefore, the S/N ratio and the reduction of the distortion factor can be improved over the frequency zone ranging from the low frequency band to the high frequency band.

According to the first aspect of the invention, the class D amplifier includes: an integrating circuit which integrates an input signal; a flash A/D converter which A/D converts an output signal of the integrating circuit; a waveform converting circuit which produces a PWM signal of a pulse width that corresponds to a digital value output from the flash A/D converter; a switching circuit which is configured by a pair of switching elements connected between a first power source and a second power source, a junction point of the pair of switching elements being connected to a load; a driving circuit which drives the pair of switching elements on the basis of the PWM signal output from the waveform converting circuit; and a feedback circuit which is connected between the junction point of the pair of switching elements and an input side of the integrating circuit, and which negatively feeds back an output signal of the amplifier that is to be supplied to the load. Therefore, the S/N ratio and the reduction of the distortion factor can be improved.

According to the second aspect of the invention, the waveform converting circuit has: storing means for storing waveform information of the PWM signal of a pulse width that corresponds to the digital value; reading means for reading out the waveform information of the PWM signal from the storing means, on the basis of the digital value output from the flash A/D converter; and outputting means for outputting the PWM signal on the basis of the waveform information which is read out by the reading means. Therefore, the switching frequency can be managed, and even an input of a signal in synchronized relationship, such as a 1-bit signal is enabled.

According to the third aspect of the invention, the feedback circuit is configured by: a first feedback loop which allows high frequency components of the output signal that is to be supplied to the load, to pass; and a second feedback loop which allows low frequency components of the output signal to pass. Therefore, the S/N ratio and the reduction of the distortion factor can be improved over the frequency zone ranging from the low frequency band to the high frequency band.

What is claimed is:

1. A class D amplifier comprising:

an integrating circuit for integrating an input signal;

a flash A/D converter for A/D converting an output signal of the integrating circuit;

a waveform converting circuit for producing a PWM signal including a pulse width corresponding to a digital value output from the flash A/D converter;

a switching circuit, for producing an amplified signal, including a pair of switching elements connected between a first power source and a second power source, a junction portion of the pair of switching elements being connected to a load;

a driving circuit for driving the pair of switching elements on the basis of the PWM signal output from the waveform converting circuit; and a feedback circuit which is connected between the junction point of the pair of switching elements and an input side of the integrating circuit, and negatively feeds back the amplified signal that is to be supplied to the load.

2. The class D amplifier according to claim 1, wherein the waveform converting circuit includes:

a storing unit for storing waveform information of the PWM signal of a pulse width corresponding to the digital value;

a reading unit for reading out the waveform information of the PWM signal from the storing unit on the basis off the digital value output from the flash A/D converter; and an outputting unit for outputting the PWM signal on the basis of the waveform information which is read out by the reading unit.

3. The class D amplifier according to claim 1, wherein a low-pass filter for removing signal components of carrier frequency from the amplified signal is interposed between the junction potion of the pair of switching elements and the load, and the feedback circuit is connected to an input side of the low-pass filter.

4. The class D amplifier according to claim 1, wherein the feedback circuit includes: a first feedback loop which allows high frequency components of the output signal that is to be supplied to the load, to pass; and a second feedback loop which allows low frequency components of the output signal to pass.

* * * * *